United States Patent
Hu et al.

(10) Patent No.: US 11,881,852 B2
(45) Date of Patent: Jan. 23, 2024

(54) OPERATOR FOR CONTROLLING ELECTRICALLY ADJUSTABLE FURNITURE

(71) Applicant: ZHEJIANG JIECANG LINEAR MOTION TECHNOLOGY CO., LTD., Zhejiang (CN)

(72) Inventors: Renchang Hu, Zhejiang (CN); Xiaojian Lu, Zhejiang (CN); Xueli Chen, Zhejiang (CN); Zhekang Zhang, Zhejiang (CN); Shaoping Zhou, Zhejiang (CN)

(73) Assignee: ZHEJIANG JIECANG LINEAR MOTION TECHNOLOGY CO., LTD., Zhejiang (CN)

( * ) Notice: Subject to any disclaimer, the term of this patent is extended or adjusted under 35 U.S.C. 154(b) by 128 days.

(21) Appl. No.: 17/630,168

(22) PCT Filed: Aug. 17, 2020

(86) PCT No.: PCT/CN2020/109659
§ 371 (c)(1),
(2) Date: Jan. 26, 2022

(87) PCT Pub. No.: WO2021/052083
PCT Pub. Date: Mar. 25, 2021

(65) Prior Publication Data
US 2022/0286131 A1 Sep. 8, 2022

(30) Foreign Application Priority Data
Sep. 19, 2019 (CN) .......................... 201910886917.9

(51) Int. Cl.
*H03K 17/96* (2006.01)
(52) U.S. Cl.
CPC ............ *H03K 17/9622* (2013.01); *H03K 2217/960755* (2013.01)

(58) Field of Classification Search
CPC ............ H03K 17/965; H03K 17/9622; H03K 2217/9651; H03K 17/962;
(Continued)

(56) References Cited

U.S. PATENT DOCUMENTS

| 10,925,404 B2 * | 2/2021 | Rains ..................... A47C 7/624 |
| 2014/0197666 A1 * | 7/2014 | Koch ................... A47C 31/008 |
| | | 297/217.3 |

(Continued)

FOREIGN PATENT DOCUMENTS

| CN | 102832921 | 12/2012 |
| CN | 105719882 | 6/2016 |

(Continued)

OTHER PUBLICATIONS

"Search Report of Europe Counterpart Application", dated Sep. 22, 2022, p. 1-p. 9.

*Primary Examiner* — Muhammad N Edun
(74) *Attorney, Agent, or Firm* — JCIPRNET

(57) ABSTRACT

An operator for controlling electrically adjustable furniture includes a housing and an actuation panel movably supported in the housing to form a cover body. A circuit board is provided in the housing, and a main control unit for detecting an actuation signal is provided on the circuit board. A first switch for generating a first actuation signal and a second switch for generating a second actuation signal are provided between the actuation panel and the main control unit, and a third switch for generating a third actuation signal is provided between a bottom wall of the housing and the main control unit. The main control unit issues a first command when simultaneously detecting the first actuation signal and the second actuation signal, and the main control
(Continued)

unit issues a second command when simultaneously detecting the first actuation signal, the second actuation signal, and the third actuation signal.

12 Claims, 3 Drawing Sheets

(58) Field of Classification Search
CPC .......... H03K 2217/94052; H03K 2217/94084; H03K 2217/94036; H03K 2217/960755; H03K 17/9618

See application file for complete search history.

(56) References Cited

U.S. PATENT DOCUMENTS

| | | | |
|---|---|---|---|
| 2016/0081866 A1* | 3/2016 | Hille | A47C 31/008 |
| | | | 700/275 |
| 2016/0181033 A1 | 6/2016 | Brudzynsky et al. | |
| 2016/0280097 A1* | 9/2016 | Hotary | B60N 2/0244 |
| 2019/0374039 A1 | 12/2019 | Hosokawa et al. | |

FOREIGN PATENT DOCUMENTS

| | | |
|---|---|---|
| CN | 206116221 | 4/2017 |
| CN | 108306634 | 7/2018 |
| CN | 108944661 | 12/2018 |
| CN | 110677148 | 1/2020 |
| CN | 210327533 | 4/2020 |
| EP | 2492786 | 8/2012 |
| JP | 2018198687 | 12/2018 |
| WO | 2018234281 | 12/2018 |

\* cited by examiner

OPERATOR FOR CONTROLLING ELECTRICALLY ADJUSTABLE FURNITURE

CROSS-REFERENCE TO RELATED APPLICATION

This application is a 371 of international application of PCT application serial no. PCT/CN2020/109659, filed on Aug. 17, 2020 which claims the priority benefit of China application no. 201910886917.9, filed on Sep. 19, 2019. The entirety of each of the above mentioned patent applications is hereby incorporated by reference herein and made a part of this specification.

TECHNICAL FIELD

Embodiments of the disclosure relate to operators, and more particularly relate to an operator for controlling electrically adjustable furniture.

DESCRIPTION OF RELATED ART

Smart home, which is empowered by innovative products and technologies, has transformed traditional home life and created a convenient, energy-efficient, and cozy environment for people. Electrically adjustable furniture, including electrically adjustable beds, electrically adjustable desks or chairs, automated hanging cabinets, or electric sofa, is important to constitute a smart home. An operator is applied for height, angle or otherwise adjustment of such furniture dependent on different demands of a user, so as to reach an appropriate state to offer a comfortable experience to the user. Conventional operators only adopt a single-switch actuation, such that an actuation command may be issued to a drive motor only by actuating the single switch, actuating the furniture to motion or actuating height or angle or otherwise adjustment of the furniture. The single-switch actuation is highly prone to accidental touching and easily causes hidden risks. Moreover, the single switch can only control one command, which restricts operating functions of the operator. To add new operating functions, additional switches are needed for the operator, consequences of which include re-positioning all switches, and redesigning and remoulding the casings of the switches, which significantly increase manufacturing costs.

SUMMARY

To overcome the above and other drawbacks in conventional technologies, an operator is provided, which is safe, multi-function, and practical.

Embodiments of the present disclosure provide:

An operator for controlling electrically adjustable furniture includes a housing and an actuation panel. The actuation panel is movably supported in the housing to form a cover body for the housing. A circuit board is provided in the housing; a main control unit for detecting an actuation signal is provided on the circuit board; a first switch for generating a first actuation signal and a second switch for generating a second actuation signal are provided between the actuation panel and the main control unit, and a third switch for generating a third actuation signal is provided between a bottom wall of the housing and the main control unit; the main control unit issues a command when simultaneously detecting at least two actuation signals, and the main control unit issues different commands when detecting different combinations of the actuation signals.

The present disclosure offers the following beneficial effects.

1. In the present solution, no command is issued in cases that only a single switch is actuated such that the main control unit only detects one actuation signal. A command is only issued when two or more switches are simultaneously actuated such that the main control unit simultaneously detects two or more actuation signals. In this way, the present solution effectively reduces accidental touching compared with conventional single-button actuating manner and enhances operating safety of electrically adjustable furniture.

2. A plurality of different actuation combinations are provided by simultaneously actuating two or three of the first switch, the second switch, and the third switch, such that the main control unit issues different actuation commands upon detecting different combinations of the actuation signal. Compared with the conventional single-button actuating manner, the present solution increases command types of the operator such that the operator provides more operating scenarios with more flexibility without adding components.

3. The operator in the present solution enables designing of switch combinations dependent on risks and potential hazards of operation, which balances practicality and safety. For a frequent-use scenario with minor risks and potential hazards, the actuation combination may be designed as simultaneously actuating the first switch and the second switch that are positioned closely at the same side of the main control unit, which renders a relatively low operating difficulty and a high practicality. For a scenario with relatively high risks and potential hazards, the actuation combination may be designed as simultaneously actuating the switches positioned at two sides of the main control unit, for example, simultaneously actuating a combination of the first switch and the third switch, or simultaneously actuating a combination of the second switch and the third switch. Simultaneous actuation of the switches at two sides has a relatively high operating difficulty and a relatively low mistaken operating possibility. For a scenario with very high risks and potential hazards, the actuation combination may be designed as simultaneously actuating a combination of the first switch, the second switch, and the third switch. Simultaneous actuation of more switches has a very high operating difficulty and complexity, which reduces mistaken operation of the operator to a very low level, thereby rendering the electrically adjustable furniture much safer.

In an embodiment, the first switch is a first capacitive sensing touch switch.

Since the first switch is disposed on a surface of the actuation panel, directly contacts with human body, and needs to be frequently operated during use, it adopts a capacitive sensing touch switch that has no switching loss or service life limit.

In an embodiment, a first touch sensing zone is provided underneath the actuation panel, and the first capacitive sensing touch switch comprises a first capacitive touch sensing element disposed in the first touch sensing zone.

Upon touching, a human body, the actuation panel, and the touch sensing elements underneath the actuation panel form a first capacitor, which may accurately detect a valid finger touch and thus ensures product sensitivity, stability, and reliability. Since the first capacitive touch sensing element is disposed inside the operator, it is water-proof, strongly interference-resistant, and less susceptible to ambient environment. Besides, it can be hermetically sealed, rendering the actuation panel of the operator to be integrated.

In an embodiment, the second switch is a first electromechanical switch provided on the main control unit, and the actuation panel motions relative to the housing to actuate the second switch.

Since the second switch is an electromechanical switch disposed in the housing, actuation of the second switch is realized only by mechanical motion and touching of the actuation panel. With such arrangement, the second switch has a relatively low sensitivity and is less likely to be mistakenly touched.

In an embodiment, the first switch and the second switch are arranged in a straight line, such that the first switch is simultaneously actuated when the second switch is actuated, and the first actuation signal and the second actuation signal are simultaneously emitted, and then a command is issued. This arrangement avoids invalid actuation caused by only actuating the second switch without actuating the first switch.

In an embodiment, a rotating shaft parallel to the surface of the actuation panel is provided at each of two ends of the actuation panel, and a rotating shaft mounting groove for mounting the rotating shaft is provided at an upper end opening of the housing. The actuation panel rotates in the housing via the rotating shafts, and a connecting line between the rotating shafts at the two ends serves as a rotating centerline for the actuation panel.

By pressing the two ends of the actuation panel where the rotating shafts are not disposed, the end portions of the actuation panel are caused to rotate downwardly perpendicular to the upper surface of the actuation panel, thereby touching and actuating the second switch. Besides, the rotating shafts connect the actuation panel with the housing to be integral, preventing disengagement or shifting of the actuation panel.

In an embodiment, an actuation projection is provided at a bottom of the actuation panel, such that when the actuation panel rotates, the second switch is actuated via the actuation projection. Compared with the actuation panel, the actuation projection enables a faster and more accurate touch to the second switch.

In an embodiment, the third switch is a second capacitive sensing touch switch. A second touch sensing zone is provided on an inner sidewall of the bottom wall of the housing, and the second capacitive sensing touch switch comprises a second capacitive touch sensing element disposed in the second touch sensing zone. Or, the third switch is a pushbutton switch, and a button of the pushbutton switch is disposed on the bottom wall of the housing.

The third switch provides additional safety for operations which are more risky and likely cause hazards. By disposing the third switch at the bottom of the housing, accidental touching is reduced to a very low level. The third switch may also be a capacitive sensing touch switch which has a high sensitivity. The third switch may be hermetically sealed and is thus water-proof and interference-resistant. Meanwhile, sealing of the third switch renders the housing as an integrated structure. Alternatively, a pushbutton switch used as the third switch is cost-effective and easily accessible, and its simple structure facilitates installation.

In an embodiment, the main control unit issues a third command when simultaneously detecting a second actuation signal and a third actuation signal. The main control unit issues different commands dependent on different combinations of the switch actuations. As such, the present solution adds more command types and more functions to the operator without adding components or incurring extra overheads.

In an embodiment, a display is provided on the operator. The display is disposed on the actuation panel; or, the display is disposed on the housing; or the display is arranged side-by-side with the actuation panel. The display serves as a visual zone to digitally display human-machine interaction information, e.g., velocity value, height value, time, status information, etc., such that the user may intuitively and explicitly access various parameters of the electrically adjustable furniture to perform corresponding adjustment.

In an embodiment, the actuation panel comprises a first actuation panel and a second actuation panel. The first switch is a second electromechanical switch disposed on the main control unit, the second switch is a third electromechanical switch disposed on the main control unit. The first actuation panel motions to actuate the second electromechanical switch, and the second actuation panel motions to actuate the third electromechanical switch.

By configuring the first switch and the second switch as two electromechanical switches disposed underneath the two actuation panels, respectively, a command is only issued by simultaneously pressing the two panels to simultaneously actuate the first switch and the second switch, and no command is issued by pressing only one panel to actuate one switch. The electromechanical switches are easy to assemble, readily accessible, and cost effective.

The characteristics and advantages of the present disclosure will be disclosed in detail through the embodiments below with reference to the accompanying drawings.

BRIEF DESCRIPTION OF THE DRAWINGS

Hereinafter, the disclosure will be described in further detail with reference to the accompanying drawings.

DESCRIPTION OF THE EMBODIMENTS

Figure 1:
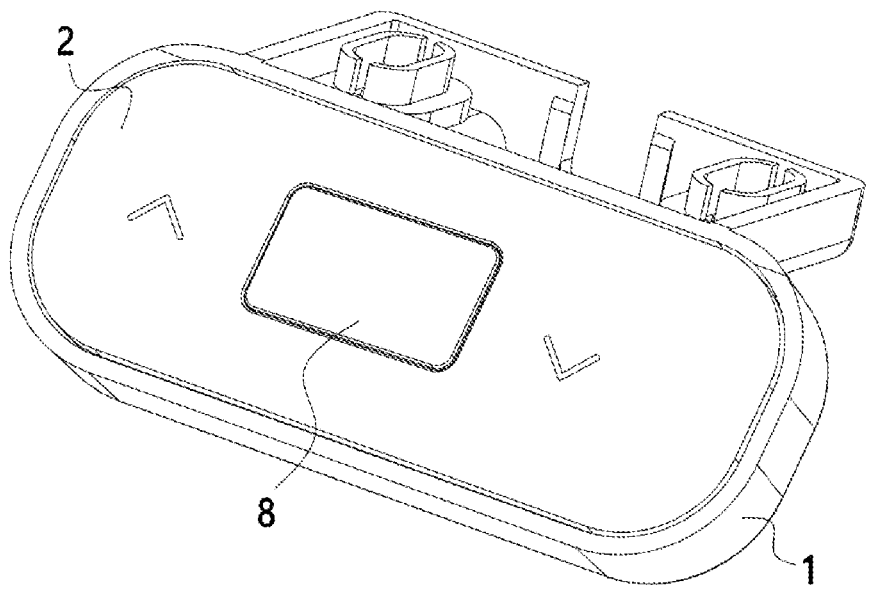
FIG. 1 is a perspective structural schematic view of an operator when a display is provided on an actuation panel according to the present disclosure.

Hereinafter, the technical solutions of the present disclosure will be explained and illustrated through the embodiments with reference to the accompanying drawings. It is noted that the embodiments are only some embodiments of the present disclosure, not all of them. Other embodiments derived by those skilled in the art without exercise of inventive work based on the examples in the embodiments all fall into the protection scope of the present disclosure.

In the description below, the orientation or position relationships indicated by the terms "inner," "outer," "upper," "lower," "left," and "right," etc. are intended only for facilitating description of the embodiments and simplifying explanations, not for indicating or implying that the devices or elements have to possess such specific orientations or have to be configured and operated with such specific orientations; therefore, they should not be construed as limitations to the present disclosure.

First Embodiment

As illustrated in FIG. 1 to FIG. 6, an operator for controlling electrically adjustable furniture comprises a housing 1 and an actuation panel 2. The actuation panel 2 is movably supported in the housing 1 to form a cover body for the housing 1. A circuit board 3 is provided in the housing 1, a main control unit for detecting an actuation signal is provided on the circuit board 3, a first switch for generating a first actuation signal and a second switch for generating a second actuation signal are provided between the actuation panel 2 and the main control unit, and a third switch for generating a third actuation signal is provided between a bottom wall of the housing and the main control unit. The main control unit issues a command when simultaneously detecting at least two actuation signals, and the main control unit issues different commands when detecting different combinations of the actuation signals.

In this embodiment, no command is issued in cases that only a single switch is actuated such that the main control unit only detects one actuation signal. A command is only issued when two or more switches are simultaneously actuated such that the main control unit simultaneously detects two or more actuation signals. In this way, the present solution effectively reduces accidental touching and enhances operating safety of electrically adjustable furniture. A plurality of different actuation combinations are provided by simultaneously actuating two or three of the switches, such that different operating commands may be issued. The present solution increases command types of the operator without adding components, such that the operator may provide more operating scenarios with more flexibility. The operator of the above structure enables designing of switch combinations dependent on operating risks and potential hazards, which balances practicality and safety. For a frequent-use scenario with minor risks and potential hazards, the actuation combination may be designed as simultaneously actuating the first switch and the second switch that are positioned closely at the same side of the main control unit, rendering a relatively low operating difficulty and a high practicality. For a scenario with relatively high risks and potential hazards, the actuation combination may be designed as simultaneously actuating the switches positioned at two sides of the main control unit, for example simultaneously actuating a combination of the first switch and the third switch, or simultaneously actuating a combination of the second switch and the third switch; simultaneous actuation of the switches at two sides has a relatively high operating difficulty and a relatively low mistaken operating possibility. For a scenario with very high risks and potential hazards, the actuation combination may be designed as simultaneously actuating a combination of the first switch, the second switch, and the third switch; simultaneous actuation of more switches has a very high operating difficulty and complexity, which reduces mistaken operation of the operator to a very low level, thereby rendering the electrically adjustable furniture much safer.

Figure 2:
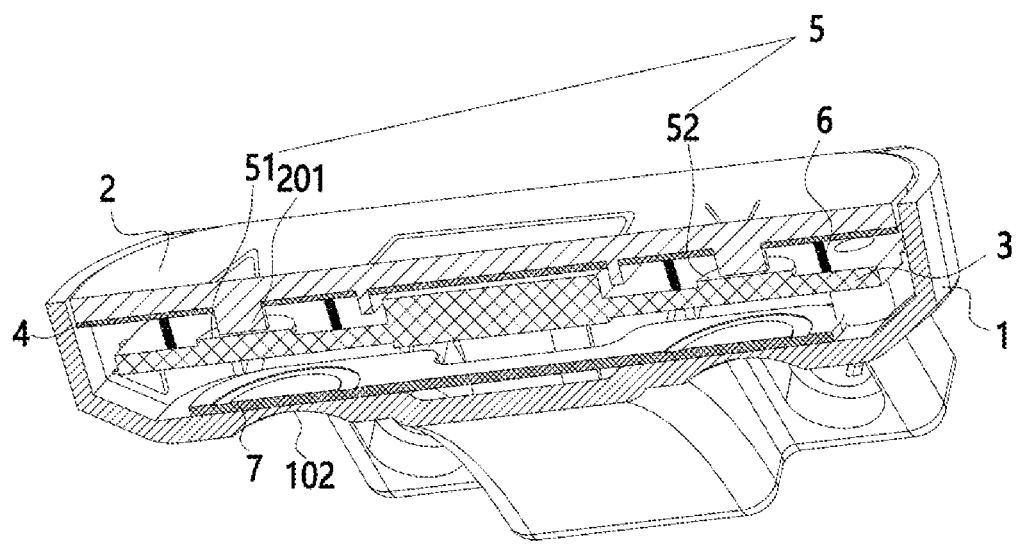
FIG. 2 is a lateral sectional view of the operator of FIG. 1.
Figure 3:
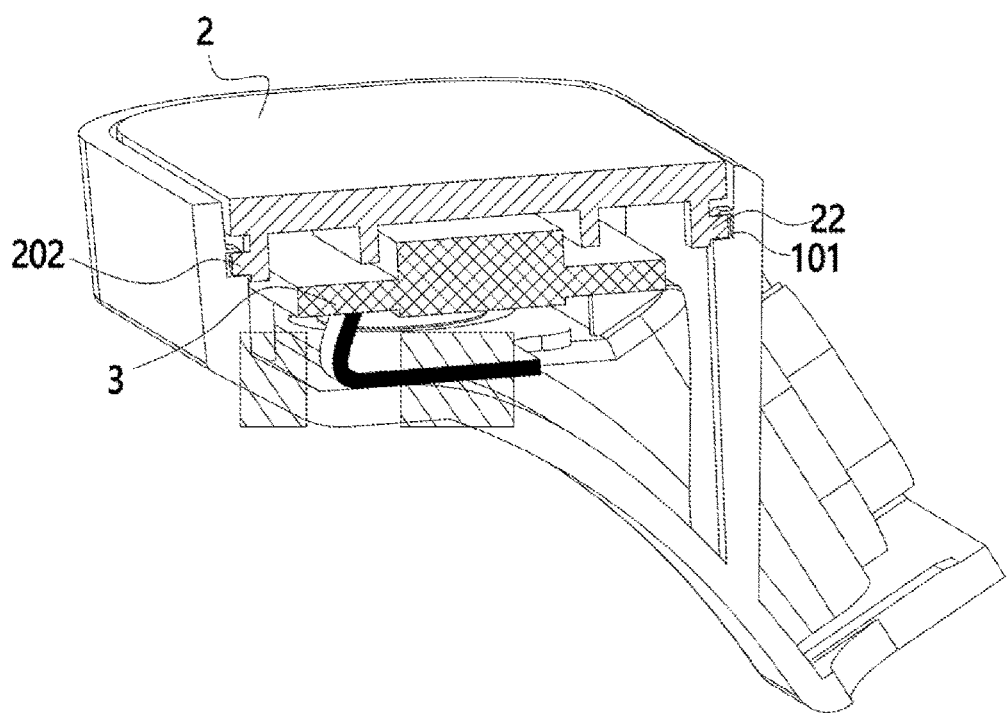
FIG. 3 is a longitudinal sectional view of the operator of FIG. 1.

The first switch is disposed on the surface of the actuation panel, directly contacts with human body, and needs to be frequently operated during use. To reduce switching loss of the first switch and extends its service life, the first switch adopts a capacitive sensing touch switch. As illustrated in FIG. 2 and FIG. 3, a first touch sensing zone 4 is provided underneath the actuation panel 2. The first capacitive sensing touch switch comprises a first capacitive touch sensing element disposed in the first touch sensing zone 4. The first capacitive touch sensing element senses a human body touch signal and transmits the signal to the main control unit. The first capacitive touch sensing element in this embodiment selects a touch film or a capacitive touch pad, which is wired and has a good sensitivity, or a touch spring, or a conductive sponge. The first capacitive touch sensing element is adhered to the underside of the actuation panel 2.

It is noted that in alternative embodiments, the first capacitive sensing touch switch is not limited to the above structure, and any structure capable of performing capacitive touch sensing functions falls within the protection scope of the present disclosure.

To present mistakenly touching the first switch and the second switch simultaneously, as illustrated in FIG. 2, the second switch is configured as a first electromechanical switch 5 disposed on the main control unit. Since the second switch is disposed inside the housing 1, accidental touching is prevented. The second switch is only actuated when an external force is applied on the actuation panel 2 to displace the actuation panel 2 relative to the housing 1. To simplify the operating procedure and ensure actuation of the first switch can when the second switch is actuated such that the first switch and the second switch emit actuation signals simultaneously, in this embodiment, the first switch and the second switch are arranged in a straight line, thereby avoiding invalid actuation caused by only actuating the second switch without actuating the first switch.

To enable the actuation panel 2 to touch the second switch more promptly and accurately, an actuation projection 201 is provided at the bottom of the actuation panel 2, such that the second switch is touched and actuated via the actuation projections 201. The motion of the actuation panel 2 in the housing 1 may be a vertical movement or a downward rotation perpendicular to the upper surface of the actuation panel 2. In cases of rotation, a rotating shaft 202 parallel to a surface of the actuation panel 2 is provided at each of two ends of the actuation panel 2, and rotating shaft mounting grooves 101 for respectively mounting the rotating shafts 202 is provided at an upper end opening of the housing 1. The actuation panel 2 rotates in the housing 1 via the rotating shafts 202, and the connection line between the rotating shafts 202 at the two ends serves as a rotating centerline for the actuation panel 2. By pressing the two ends of the actuation panel 2 where the rotating shafts 202 are not disposed, the actuation projections 201 are caused to touch and actuate the second switch. Besides, the rotating shafts 202 connect the actuation panel 2 and the housing 1 to be integral, thereby preventing disengagement or shifting of the actuation panel 2. Furthermore, to facilitate reset of the actuated actuation panel 2, a plurality of reset springs 6 are provided between the actuation panel 2 and the circuit board 3.

In cases that the first touch sensing element adopts a touch spring or conductive sponge, electrical current may be directly transmitted to the main control unit. Alternatively, the second switch may be directly touched by motioning of the actuation panel 2, which eliminates a need of additionally providing a wire and an actuation projection.

Figure 4:
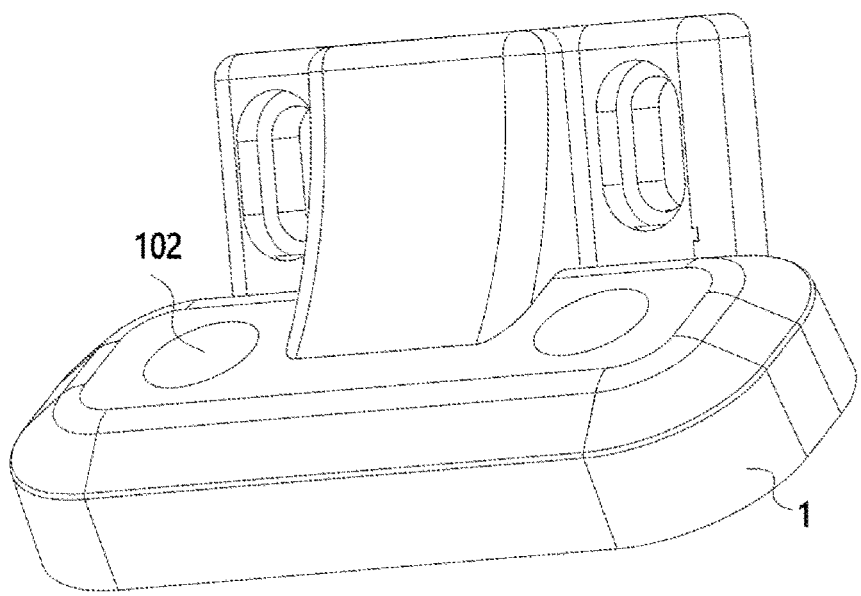
FIG. 4 is a perspective structural schematic view of the operator according to the present disclosure taken from another angle.

To provide additional safety for operating with relatively serious risks and potential hazards, as illustrated in FIG. 4, the third switch is operated via the bottom wall of the housing 1, which renders a very low accidental touching possibility. The third switch is configured as a second capacitive sensing touch switch. A recessed touch zone 102 facilitating touch is provided on an outer sidewall of the bottom wall of the housing 1, and a second touch sensing zone 7 is provided on the inner sidewall of the bottom wall of the housing 1. The second capacitive sensing touch switch comprises a second capacitive touch sensing element disposed in the second touch sensing zone 7. By configuring the third switch also as a capacitive sensing touch switch, a high sensitivity is provided. Besides, the third switch may be hermetically sealed and is thus water-proof and interference-resistant, and meanwhile, such a configuration also ensures integrity of the housing 1.

Figure 5:
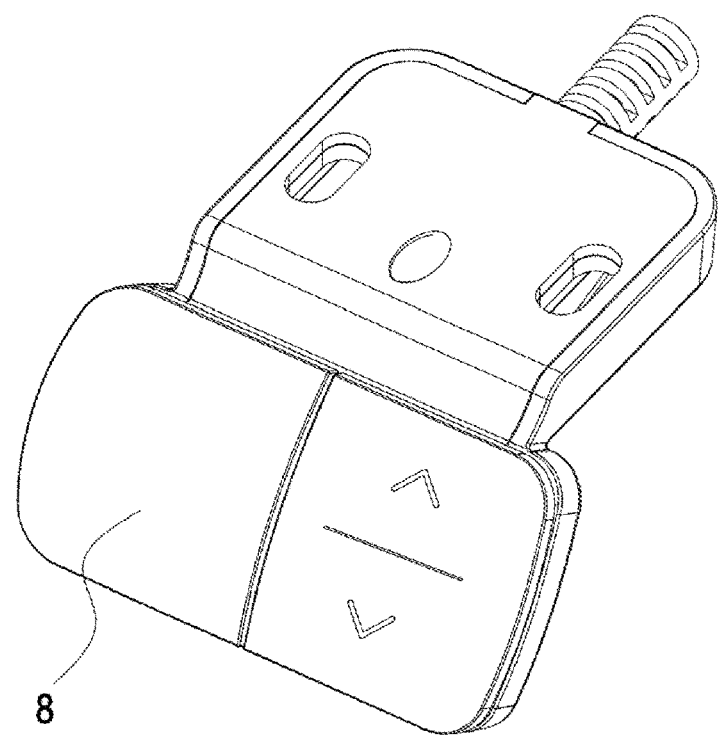
FIG. 5 is a perspective structural schematic view of an operator when a display is arranged side-by-side with an actuation panel according to the present disclosure.

To enable a user to access various parameters of the electrically adjustable furniture in an intuitive and explicit manner, a display 8 is provided on the operator. A recessed groove is provided on the housing 1 of the operator. The display 8 projects through the recessed groove; or as illustrated in FIG. 1, the display 8 is provided on the actuation panel 2; or as illustrated in FIG. 5, the display 8 is arranged side-by-side with the actuation panel 2. The display 8 serves as a visual zone to digitally display human-machine interaction information, such as velocity value, height value, time, status information, etc., providing a reference for corresponding adjustment.

It is understood that a plurality of switching units comprising the first switch, the second switch, and the third switch may be integrated in one operator so as to control different motions of the furniture, e.g., lifting or descending at different velocities, or adjusting different tilt angles, etc. The plurality of switching units may be distinguished and operated via corresponding marks on the surface of the actuation panel.

Second Embodiment

This embodiment differs from the first embodiment in that the third switch uses a pushbutton switch, and a button of the pushbutton switch is provided on the bottom wall of the housing. Disposing the button on the bottom wall of the pushbutton switch renders a very low accidental touching possibility.

Third Embodiment

This embodiment differs from the first embodiment and the second embodiment in that when the actuation panel 2 rotates in the housing 1 to perform actuation, the second switch may be configured as two or more electromechanical switches disposed in different control zones of the main unit. In this case, the plurality of electromechanical switches are used in common combination with the first switch and the third switch in use, i.e., used in common combination with the first touch sensing zone 4 on the underside of the actuation panel 2 and the second touch sensing zone 7 disposed at the inner side of the bottom wall of the housing 1, such that by pressing different electromechanical switches, different commands may be issued. With the operator controlling a lift platform as an example, the second switch is configured as a lifting electromechanical switch 51 generating a lift signal and a descending electromechanical switch 52 generating a descend signal, respectively. The lifting electromechanical switch 51 and the descending electromechanical switch 52 are disposed at two ends of the actuation panel 2 where the rotating shafts 202 are not disposed, respectively, such that the lifting and descending actuations are performed separately without mutual interference.

Fourth Embodiment

Figure 6:
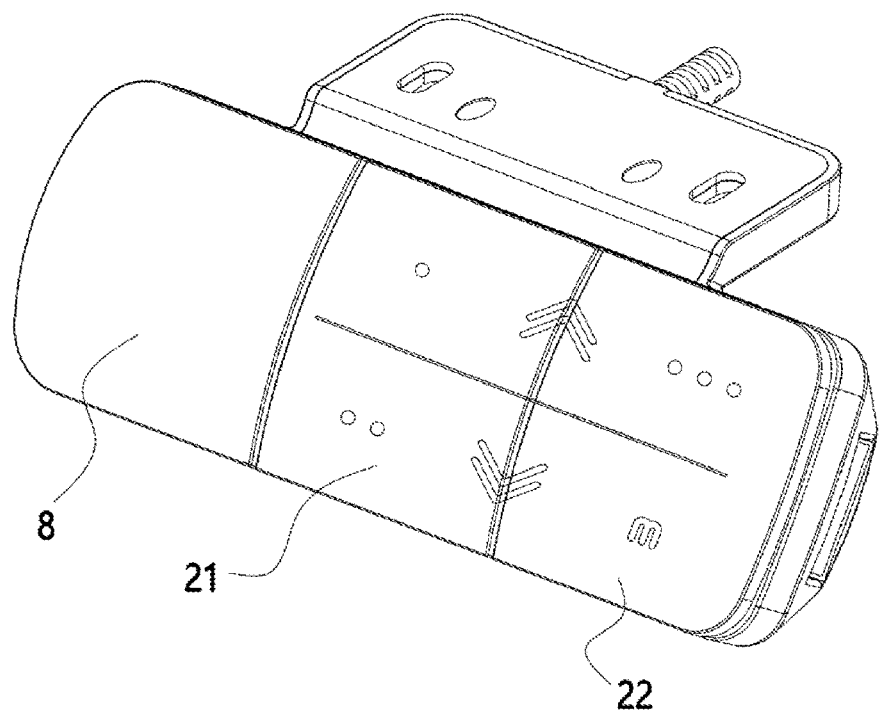
FIG. 6 is a structural schematic diagram of an operator according to a fourth embodiment of the disclosure.

This embodiment differs from the third embodiment in that, as illustrated in FIG. 6, the actuation panel 2 comprises a first actuation panel 21 configured as a second electromechanical switch disposed on the main control unit, and a second actuation panel 22 configured as a third electromechanical switch disposed on the main control unit. The first actuation panel 21 motions to actuate the second electromechanical switch, and the second actuation panel 22 motions to actuate the third electromechanical switch.

In this embodiment, the first actuation panel 21 and the second actuation panel 22 are arranged to closely abut with each other, such that the operation of pressing the two panels may be completed by one finger.

What have been described above are only embodiments of the present disclosure; however, the protection scope of the present disclosure is not limited thereto. A person skilled in the art should understand that the disclosure includes, but is not limited to, the contents having been described in the drawings and the embodiments. Any modifications without departing from the functions and structural principles of the disclosure will be included within the scope of the claims.

What is claimed is:

1. An operator for controlling electrically adjustable furniture, comprising:
a housing and an actuation panel, wherein the actuation panel is movably supported in the housing to form a cover body for the housing; a circuit board is provided in the housing;
a main control unit for detecting an actuation signal is provided on the circuit board;
a first switch for generating a first actuation signal and a second switch for generating a second actuation signal are provided between the actuation panel and the main control unit, wherein the first switch is a capacitive sensing touch switch disposed on a surface of the actuation panel and the second switch is an electromechanical switch disposed in the housing; and
a third switch for generating a third actuation signal is provided between a bottom wall of the housing and the main control unit;
wherein the main control unit issues a command when simultaneously detecting at least two of the first actuation signal, the second actuation signal, and the third actuation signal, and the main control unit issues different commands when detecting different combinations of the first, second and third actuation signals.

2. The operator for controlling electrically adjustable furniture according to claim 1, wherein the first switch is a first capacitive sensing touch switch.

3. The operator for controlling electrically adjustable furniture according to claim 2, wherein a first touch sensing zone is provided underneath the actuation panel, and the first capacitive sensing touch switch comprises a first capacitive touch sensing element disposed in the first touch sensing zone.

4. The operator for controlling electrically adjustable furniture according to claim 1, wherein the second switch is a first electromechanical switch provided on the main control unit, and the actuation panel motions relative to the housing to actuate the second switch.

5. The operator for controlling electrically adjustable furniture according to claim 4, wherein the first switch and the second switch are aligned in a vertical line perpendicular to the actuation panel, such that the first switch is simultaneously actuated when the second switch is actuated.

6. The operator for controlling electrically adjustable furniture according to claim 5, wherein a rotating shaft parallel to a surface of the actuation panel is provided at each of two ends of the actuation panel, and a rotating shaft mounting groove for mounting the rotating shaft is provided at an upper end opening of the housing, the actuation panel rotates in the housing via the rotating shafts, and a connecting line between the rotating shafts at the two ends serves as a rotating centerline for the actuation panel.

7. The operator for controlling electrically adjustable furniture according to claim 6, wherein an actuation projection is provided at a bottom of the actuation panel, such that when the actuation panel rotates, the second switch is actuated via the actuation projection.

8. The operator for controlling electrically adjustable furniture according to claim 4, wherein a rotating shaft parallel to a surface of the actuation panel is provided at each of two ends of the actuation panel, and a rotating shaft mounting groove for mounting the rotating shaft is provided at an upper end opening of the housing, the actuation panel rotates in the housing via the rotating shafts, and a connecting line between the rotating shafts at the two ends serves as a rotating centerline for the actuation panel.

9. The operator for controlling electrically adjustable furniture according to claim 8, wherein an actuation projection is provided at a bottom of the actuation panel, such that when the actuation panel rotates, the second switch is actuated via the actuation projection.

10. The operator for controlling electrically adjustable furniture according to claim 1, wherein the third switch is a second capacitive sensing touch switch, a second touch sensing zone is provided on an inner sidewall of the bottom wall of the housing, and the second capacitive sensing touch switch comprises a second capacitive touch sensing element disposed in the second touch sensing zone; or the third switch is a pushbutton switch, and a button of the pushbutton switch is disposed on the bottom wall of the housing.

11. The operator for controlling electrically adjustable furniture according to claim 1, wherein a display is provided on the operator; the display is disposed on the actuation panel; or, the display is disposed on the housing; or the display is arranged side-by-side with the actuation panel.

12. The operator for controlling electrically adjustable furniture according to claim 1, wherein the actuation panel comprises a first actuation panel and a second actuation panel; wherein the first switch is a second electromechanical switch disposed on the main control unit, the second switch is a third electromechanical switch disposed on the main control unit, and the first actuation panel motions to actuate the second electromechanical switch, and the second actuation panel motions to actuate the third electromechanical switch.

* * * * *